US009869858B2

(12) United States Patent
Gerson et al.

(10) Patent No.: US 9,869,858 B2
(45) Date of Patent: Jan. 16, 2018

(54) ELECTRICAL TUNING OF RESONANT SCANNING

(71) Applicant: APPLE INC., Cupertino, CA (US)

(72) Inventors: Yuval Gerson, Sunnyvale, CA (US); Alexander Shpunt, Portola Valley, CA (US)

(73) Assignee: APPLE INC., Cupertino, CA (US)

(*) Notice: Subject to any disclaimer, the term of this patent is extended or adjusted under 35 U.S.C. 154(b) by 96 days.

(21) Appl. No.: 14/955,060

(22) Filed: Dec. 1, 2015

(65) Prior Publication Data

US 2017/0153445 A1    Jun. 1, 2017

(51) Int. Cl.
| | | |
|---|---|---|
| *G01S 17/42* | (2006.01) | |
| *G02B 26/10* | (2006.01) | |
| *B81B 3/00* | (2006.01) | |
| *B81C 1/00* | (2006.01) | |
| *G01S 7/481* | (2006.01) | |
| *G01S 17/89* | (2006.01) | |
| *G01S 7/497* | (2006.01) | |

(Continued)

(52) U.S. Cl.
CPC ............ *G02B 26/101* (2013.01); *B81B 3/007* (2013.01); *B81C 1/00515* (2013.01); *G01S 7/4817* (2013.01); *G01S 7/497* (2013.01); *G01S 17/10* (2013.01); *G01S 17/42* (2013.01); *G01S 17/89* (2013.01); *G02B 26/0833* (2013.01); *B81B 2201/033* (2013.01); *B81B 2201/034* (2013.01); *B81B 2201/047* (2013.01); *B81B 2203/0136* (2013.01); *B81B 2203/058* (2013.01); *B81B 2207/015* (2013.01); *B81C 2201/0111* (2013.01)

(58) Field of Classification Search
CPC .......... G01S 17/10; G01S 7/497; G01S 7/4817
See application file for complete search history.

(56) References Cited

U.S. PATENT DOCUMENTS 6,245,590 B1    6/2001    Wine et al.
6,865,313 B2    3/2005    Mao et al.
(Continued)

FOREIGN PATENT DOCUMENTS

EP    1719012 A2    11/2006
WO    2015109273 A2    7/2015

OTHER PUBLICATIONS

Milanovic et al., "Gimbal-less Monolithic Silicon Actuators for Tip-Tilt-Piston Micromirror Applications", IEEE Journal of Select Topics in Quantum Electronics, vol. 10, Issue 3, pp. 462-471, May-Jun. 2004.

(Continued)

*Primary Examiner* — Tony Ko
(74) *Attorney, Agent, or Firm* — D. Kligler IP Services Ltd.

(57) ABSTRACT

A scanning device includes a frame, having a central opening, and an array including a plurality of parallel mirrors contained within the central opening of the frame. Hinges respectively connect the mirrors to the frame and define respective, mutually-parallel axes of rotation of the mirrors relative to the frame. A main drive applies a driving force to the array so as to drive an oscillation of the mirrors about the hinges at a resonant frequency of the array. A sensor is configured to detect a discrepancy in a synchronization of the oscillation among the mirrors in the array, and an adjustment circuit applies a corrective signal to at least one of the mirrors in order to alleviate the detected discrepancy.

18 Claims, 3 Drawing Sheets

(51) Int. Cl.
*G02B 26/08* (2006.01)
*G01S 17/10* (2006.01)

(56) References Cited

U.S. PATENT DOCUMENTS

| | | |
|---|---|---|
| 7,428,353 B1 | 9/2008 | Milanovic et al. |
| 7,952,781 B2 | 5/2011 | Weiss et al. |
| 8,514,205 B2 | 8/2013 | Davis et al. |
| 2009/0244668 A1 | 10/2009 | Fujino et al. |
| 2009/0245299 A1* | 10/2009 | Stern ................. G02B 26/0841 372/24 |
| 2013/0207970 A1 | 8/2013 | Shpunt et al. |
| 2015/0204650 A1 | 7/2015 | Erlich |
| 2015/0260847 A1 | 9/2015 | Sromin et al. |
| 2016/0146939 A1 | 5/2016 | Shpunt et al. |
| 2016/0320609 A1* | 11/2016 | Koarai ............... G02B 26/0833 |

OTHER PUBLICATIONS

Erlich et al., U.S. Appl. No. 14/622,942, filed Feb. 16, 2015.

* cited by examiner

ELECTRICAL TUNING OF RESONANT SCANNING

FIELD OF THE INVENTION

The present invention relates generally to micro-mechanical systems (MEMS), and particularly to optical scanning using such systems.

BACKGROUND

MEMS-based optical scanners are used in a variety of applications. For example, U.S. Pat. No. 7,952,781, whose disclosure is incorporated herein by reference, describes a method of scanning a light beam and a method of manufacturing a microelectromechanical system (MEMS), which can be incorporated in a scanning device.

As another example, U.S. Pat. No. 6,245,590 describes a MEMS scanning device with a variable resonant frequency. In one embodiment, an array of removable masses are placed on an exposed portion of an oscillatory body and selectively removed to establish the resonant frequency. A display apparatus includes the scanning device, wherein the scanning device scans about two or more axes, typically in a raster pattern. Various approaches to controlling the frequency responses of the scanning device are described, including active control of MEMS scanners and passive frequency tuning.

U.S. Patent Application Publication 2013/0207970, whose disclosure is incorporated herein by reference, describes a scanning depth engine, which includes a transmitter, which emits a beam comprising pulses of light, and a scanner, which is configured to scan the beam, within a predefined scan range, over a scene. The scanner may comprise a micromirror produced using MEMS technology. A receiver receives the light reflected from the scene and generates an output indicative of the time of flight of the pulses to and from points in the scene. A processor is coupled to control the scanner and to process the output of the receiver so as to generate a 3D map of the scene.

U.S. Patent Application Publication 2015/0260847, whose disclosure is incorporated herein by reference, describes a dual-axis scanning mirror, in which a scanning mirror assembly includes a support structure; a base, which is mounted to rotate about a first axis relative to the support structure; and a mirror, which is mounted to rotate about a second axis relative to the base. At least one rotor includes one or more permanent magnets, which are fixed to the scanning mirror assembly and which are positioned in an air gap of a magnetic stator so as to move in response to a magnetic circuit formed by the stator due to a driving electrical current.

PCT International Publication WO 2015/109273, whose disclosure is incorporated herein by reference, describes a scanning device, which includes a substrate, which is etched to define an array of two or more parallel rotating members, such as scanning mirrors, and a gimbal surrounding the rotating members. First hinges connect the gimbal to the substrate and define a first axis of rotation, about which the gimbal rotates relative to the substrate. Second hinges connect the rotating members to the support and define respective second, mutually-parallel axes of rotation of the rotating members relative to the support, which are not parallel to the first axis. In some embodiments, coupling means between the mirrors in the array couple the oscillations of the mirrors and thus maintain the synchronization between them.

Electrostatic comb drives are sometimes used in driving rotations of MEMS mirrors, with an appropriate electrical waveform applied to the comb drive in order to drive the mirror. In the regard, for example, U.S. Pat. No. 8,514,205 describes a drive circuit that includes a generator and a driver. The generator generates a signal having a period and a varying amplitude during a driving portion of the period. The driver is coupled to the generator and drives a plate of an electrostatically drivable plant with the signal. The drive circuit may be used to drive a mirror plate of a comb-drive MEMS mirror.

SUMMARY

Embodiments of the present invention that are described hereinbelow provide improved scanning devices and methods.

There is therefore provided, in accordance with an embodiment of the invention, a scanning device, including a frame, having a central opening, and an array including a plurality of parallel mirrors contained within the central opening of the frame. Hinges respectively connect the mirrors to the frame and define respective, mutually-parallel axes of rotation of the mirrors relative to the frame. A main drive is configured to apply a driving force to the array so as to drive an oscillation of the mirrors about the hinges at a resonant frequency of the array. A sensor is configured to detect a discrepancy in a synchronization of the oscillation among the mirrors in the array. An adjustment circuit is coupled to apply a corrective signal to at least one of the mirrors in order to alleviate the detected discrepancy.

In a disclosed embodiment, the frame, the mirrors, and the hinges include an epitaxial semiconductor material, which is etched to define and separate the mirrors and the hinges from the frame, and the hinges include torsion hinges.

In some embodiments, the device includes a base surrounding the frame and rotationally connected to the frame so that the frame rotates, relative to the base, about a frame axis that is perpendicular to the mutually-parallel axes of rotation of the mirrors. In one embodiment, the main drive is configured to apply the driving force to the frame so as to cause the frame to rotate about the frame axis relative to the base, and the mirrors are weighted asymmetrically so as to couple the oscillation of the mirrors about the respective axes to the rotation of the frame about the frame axis. Typically, the driving force is applied to the frame at a gimbal frequency that is less than half of the resonant frequency of the array.

In some embodiments, the adjustment circuit includes a first conductive comb attached to an edge of at least one of the mirrors and a second conductive comb attached to the frame so as to interleave with the first conductive comb, and the corrective signal is applied as an electrical potential difference between the first and second conductive combs. In one embodiment, the electrical potential difference includes a DC potential, which damps the oscillation of the at least one of the mirrors. Additionally or alternatively, the electrical potential difference includes a time-varying potential, which is applied at the resonant frequency.

In an alternative embodiment, the adjustment circuit includes a heating trace formed in a vicinity of one or more of the hinges, and the corrective signal is applied as a current flowing through the heating trace so as to increase a temperature of at least one of the hinges.

In a disclosed embodiment, the device includes a transmitter, which is configured to emit a beam of light toward a first mirror in the array, which reflects the beam so that as to scan the beam over a scene, and a receiver, which is configured to receive, by reflection from at least second mirror in the array, the light reflected from the scene and to generate an output indicative of the light received from points in the scene.

There is also provided, in accordance with an embodiment of the invention, a method for producing a scanning device. The method includes etching a semiconductor wafer to define a frame, having a central opening, an array including a plurality of parallel mirrors contained within the central opening of the frame, and hinges, which respectively connect the mirrors to the frame and define respective, mutually-parallel axes of rotation of the mirrors relative to the frame. A main drive is coupled to apply a driving force to the array so as to drive an oscillation of the mirrors about the hinges at a resonant frequency of the array. A sensor is coupled to detect a discrepancy in a synchronization of the oscillation among the mirrors in the array. An adjustment circuit is coupled to apply a corrective signal to at least one of the mirrors in order to alleviate the detected discrepancy.

The present invention will be more fully understood from the following detailed description of the embodiments thereof, taken together with the drawings in which:

DETAILED DESCRIPTION OF EMBODIMENTS

Figure 1:
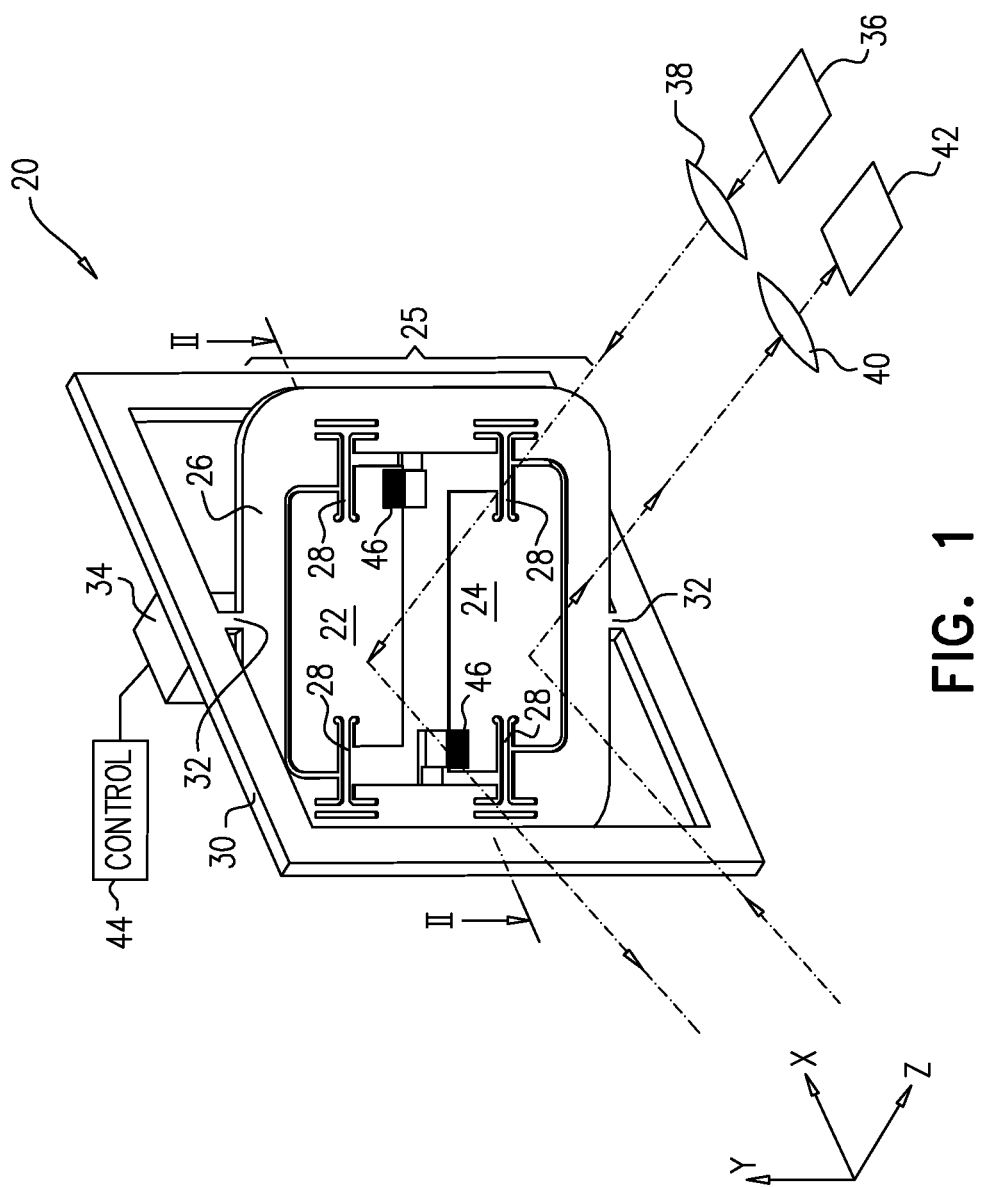
FIG. 1 is a schematic pictorial illustration of a scanning device, in accordance with an embodiment of the invention.

The above-mentioned PCT International Publication WO 2015/109273 describes arrays of multiple scanning mirrors that are weakly coupled together in order to synchronize the oscillations of the mirrors in the array. U.S. patent application Ser. No. 14/551,104, filed Nov. 24, 2014, whose disclosure is incorporated herein by reference, describes an application of this technique in synchronizing separate transmit (Tx) and receive (Rx) mirrors. An advantage of the approach described in these references is that the individual mirrors in the array have low inertia and can be thus be driven with minimal power input at oscillation frequencies near the system resonant frequency. In practice, however, even small manufacturing deviations in the dimensions of the mirrors and the hinges on which they are mounted can lead to loss of precise synchronization between the mirrors in the array. For example, although the mirrors may oscillate at the same frequency, the amplitudes of oscillation may differ among the mirrors, resulting in discrepancies between the respective scan angles.

Embodiments of the present invention that are described herein address this problem by electrically adjusting the effective stiffness of the mirror hinges in order to synchronize the rotations of the mirrors in the array. In other words, appropriate electrical signals are applied to the MEMS array in order to compensate for mechanical deviations among the mirrors and/or the hinges. Thus, in the example cited above, when one mirror oscillates at a greater amplitude than another, the effective stiffness of the hinges of the mirror with the greater amplitude may be increased in order to damp its oscillation, or the effective stiffness of the hinges of the other mirror may, additionally or alternatively, be decreased. (The term "effective stiffness," as used herein, refers to the resistance or compliance of a given mirror to rotation, which is affected not only by the actual, physical stiffness of the hinges, but also by other forces that damp or boost the oscillation of the mirror.) Although the disclosed embodiments are particularly useful in the context of MEMS devices, the principles of the present invention may similarly be applied, mutatis mutandis, to other types of scanning arrays.

In the disclosed embodiments, a scanning device comprises an array of parallel mirrors contained within a central opening of a frame, such as a gimbal. The mirrors are connected to the frame by hinges along respective, mutually-parallel axes of rotation. A main drive applies a driving force to the array, which causes the mirrors to oscillate about the hinges at a resonant frequency of the array. A sensor, meanwhile, detects discrepancies in synchronization of the oscillation among the mirrors, such as variations in scan amplitude or, possibly, phase or frequency variations. In order to alleviate the detected discrepancy, an adjustment circuit applies a corrective signal to at least one of the mirrors.

In some embodiments, the adjustment circuit comprises an electrostatic comb drive, in which a first conductive comb is attached to the edge of at least one of the mirrors, and a second conductive comb is attached to the frame so as to interleave with the first comb. An electrical potential difference is applied between the first and second conductive combs in order to correct the detected discrepancy. In one embodiment, the adjustment circuit applies a DC potential between the comb drives, thus creating an attractive force that effectively increases the stiffness of the mirror hinges and thus tends to damp the oscillation of the mirror. If a given mirror is oscillating with a greater amplitude than another, for example, such damping can be applied to the given mirror. Alternatively or additionally, the adjustment circuit may apply a time-varying potential in synchronization with the oscillation, i.e., at the resonant frequency. This latter sort of corrective signal, which is typically synchronized according to the output signal from the sensor, can be used either to give an additional "push" or to retard one of the mirrors.

In an alternative embodiment (not shown in the figures), the adjustment circuit comprises a heating trace formed in a vicinity of one or more of the hinges. The trace may be formed as part of the MEMS fabrication process on either or both of the hinge itself and the adjacent mirror and/or frame. In this case, the corrective signal is applied as a current flowing through the heating trace, which increases the temperature of the hinge. When torsion hinges are used (as in MEMS devices), the elevated temperature reduces the stiffness of the hinge and consequently increases the amplitude of oscillation of the corresponding mirror. Thus, when the sensor detects that one of the mirrors is oscillating with lower amplitude than another, the adjustment circuit can heat the hinges of the lower-amplitude mirror in order to equalize the amplitudes.

Although the embodiments shown in the figure and described below relate specifically to arrays of two mirrors, the principles of the present invention may similarly be applied to arrays containing larger numbers of mirrors. Furthermore, although the disclosed embodiments relate specifically to arrays of transmit and receive mirrors for purposes of depth mapping, synchronized mirror arrays of these sorts may alternatively be used in other application of scanned light projection and/or collection. The principles of the present invention may also be applied in other sorts of MEMS devices involving synchronized oscillation of multiple rotating elements. All such alternative configurations and applications are considered to be within the scope of the present invention.

FIG. 1 is a schematic pictorial illustration of a scanning device 20, in accordance with an embodiment of the invention. Device 20 is built around an array 25 of mirrors 22, 24. Array 25 is typically produced by etching a semiconductor wafer, such as an epitaxial silicon wafer, to define a frame 26 having a central opening, which contains the mirrors, and to separate the mirrors and associated parts of array 25 from the frame. Hinges 28, for example etched torsion hinges, connect mirrors 22 and 24 to frame 26 along respective, mutually-parallel axes, about which the mirrors rotate relative to the frame. In a typical application, the area of each of mirrors 22 and 24 is in the range of 2.5 to 50 mm$^2$, and a reflective coating is deposited on the wafer surface in the areas of mirrors 22 and 24. Alternatively, larger or even smaller scanners of this sort may be produced, depending on application requirements.

In the pictured embodiment, the wafer is also etched to define a base 30 surrounding frame 26 and rotationally connected to the frame by hinges 32, which are perpendicular to hinges 28. Thus, frame 26 serves as a gimbal and rotates, relative to base 30, about a frame axis defined by hinges 32 (shown as the Y-axis in the figures), which is perpendicular to the respective axes defined by hinges 28 of mirrors 22 and 24, about which the mirrors rotate relative to the frame. A main drive 34 applies a driving force to cause frame 26 to rotate about the frame axis, for example by application of a time-varying magnetic field, as described further hereinbelow. Alternatively, frame 26 may be mounted to rotate on bearings, as described, for example, in U.S. patent application Ser. No. 14/622,942, filed Feb. 16, 2015, whose disclosure is incorporated herein by reference. Further alternatively, frame 26 may be mounted statically, without gimbaling of the frame.

Typically, mirrors 22 and 24 are configured to rotate about hinges 28 at a resonant frequency of array 25. The resonant frequency is determined, inter alia, by the lengths, widths, and thickness of hinges 28, as well as the structure and flexibility of frame 26 and the anchors that connect the hinges to the frame. Mirrors 22 and 24 are driven in this embodiment to oscillate at their resonant frequency by mechanical coupling of rotational energy from frame 26 to the mirrors, as explained below. In alternative embodiments, however, mirrors 22 and 24 may be driven directly, for example by a suitable magnetic, electrostatic or piezoelectric drive operating at the resonant frequency.

In the pictured embodiment, mirrors 22 and 24 are shaped asymmetrically about the axes of rotation of array 25, and thus the weights of the mirrors are also distributed asymmetrically about the axes. Alternatively or additionally, an asymmetric weight distribution may be induced by thinning the rear side of some areas the mirrors or attaching small weights to the rear side of the mirrors. In any case, the asymmetric weight distribution causes the axes of rotational inertia of the mirrors to be skewed relative to the axes of rotation, and thus induces mechanical coupling between the axes of rotation of the mirrors and of the frame. In other words, the skewed axes of inertia thus created for the resonant oscillation of mirrors 22 and 24 about the axes of hinges 28 is not precisely perpendicular to the axis of hinges 32. Therefore, as main drive 34 drives frame 26 to rotate about the Y-axis at the selected drive frequency, the asymmetric weight distribution of mirrors 22 and 24 will cause the mirrors to oscillate about the axes of hinges 28 at the resonant frequency of array 25, thus generating a two-dimensional scan of the mirrors. Typically, main drive 34 drives frame 26 in a non-resonant mode, at a gimbal frequency that is less than half of the resonant frequency of array 25, and is generally less than even one-tenth of the resonant frequency.

In the embodiment that is shown in FIG. 1, a transmitter 36 emits pulses of light, which are collimated by a collimating lens 38 and directed toward mirror 22, which reflects the beam so that the rotations of the mirror and frame 26 scan the beam over a scene in a two-dimensional scan pattern. (The term "light," in the context of the present description and in the claims, refers to optical radiation of any wavelength, including visible, infrared, and ultraviolet radiation.) Light reflected back from the scene is directed by mirror 24 toward a collection lens 40, which focuses the reflected light onto a receiver 42. In alternative optical layouts (not shown in the figures), device 20 may comprise ancillary optical elements, such as reflectors and filters, in accordance with system requirements.

In any case, device 20 is designed so that mirrors 22 and 24 scan the transmitted and received beams of light together over a predefined angular range, whereby at each point in the scan, receiver 42 receives light from the same area of the scene that is illuminated at that point by transmitter 36. The fast rotation of mirrors 22 and 24 about the mirror axes and the slower rotation of frame 26 about the frame axis may be coordinated so as to define a raster scan of the transmitted and received beams over an area of interest. Alternatively, the rotations of the mirrors and frame may be controlled to generate scan patterns of other sorts.

In one embodiment, device 20 is used for depth sensing based on time of flight of the light pulses emitted by transmitter 36. In this sort of embodiment, transmitter 36 typically comprises a pulsed laser diode, while receiver 42 comprises a high-speed optoelectronic detector, such as an avalanche photodiode. Alternatively, any other suitable sorts of emitting and sensing components may be used in device 20.

A controller 44 regulates the operation of device 20. Controller 44 typically comprises logic circuits, amplifiers, and suitable interfaces in order generate drive signals to main drive 34. In addition, when there is a discrepancy in the synchronization of oscillation of mirrors 22 and 24, controller 44 drives an adjustment circuit 46 to apply a corrective signal to at least one of the mirrors 24 and 26 in order to alleviate the discrepancy. For these purposes, controller 44 may additionally comprise a microprocessor, which performs the required functions under the control of suitable software or firmware. Detection and alleviation of synchronization discrepancies in device 20 are described further hereinbelow with reference to FIG. 3.

Controller 44 may additionally perform other functions in device 20, such as driving transmitter 36 and processing signals that are output by receiver 42. These functions, however, are beyond the scope of the present disclosure.

Figure 2:
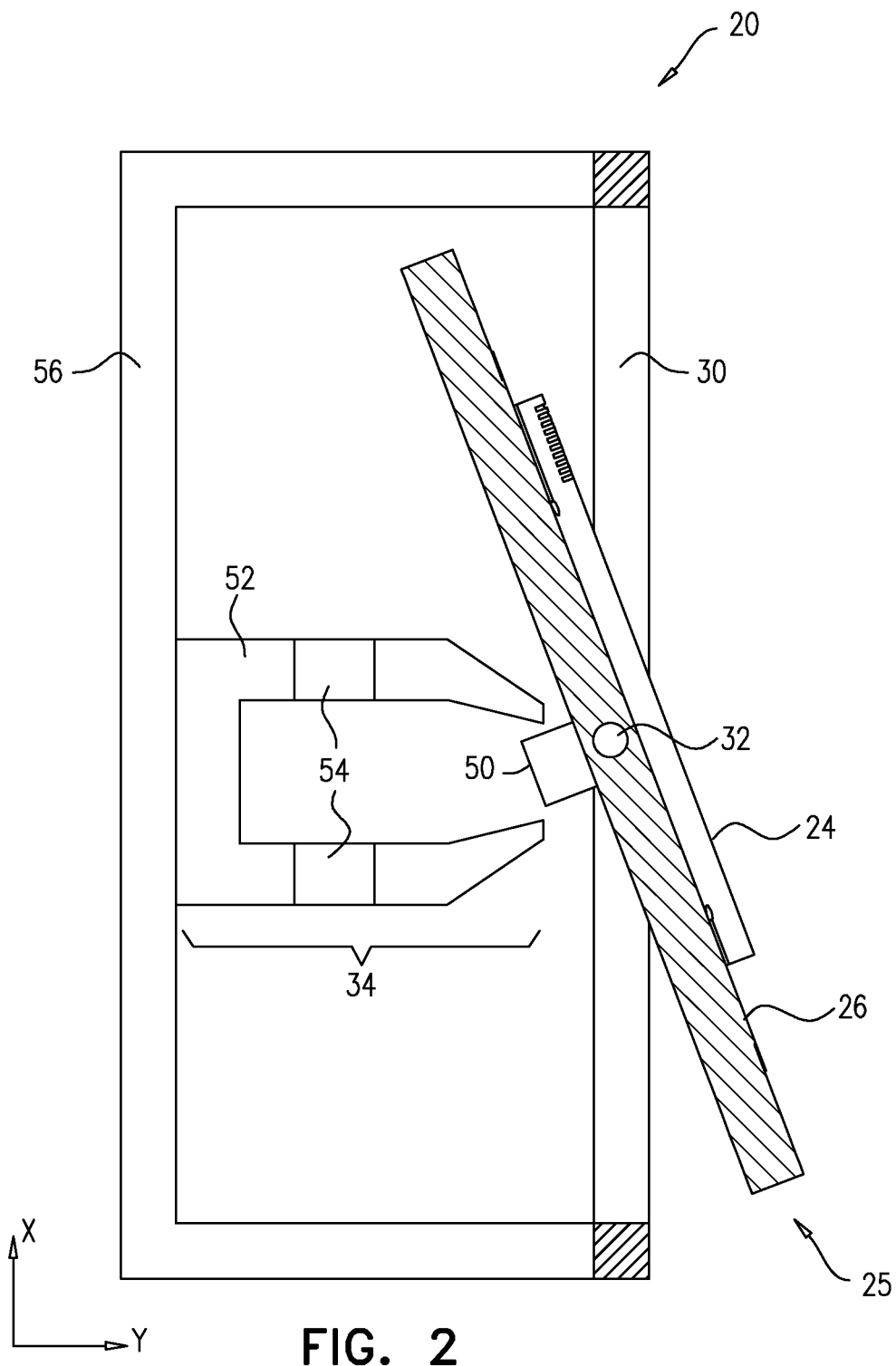
FIG. 2 is a schematic sectional view of a scanning device, in accordance with an embodiment of the invention.
Figure 3:
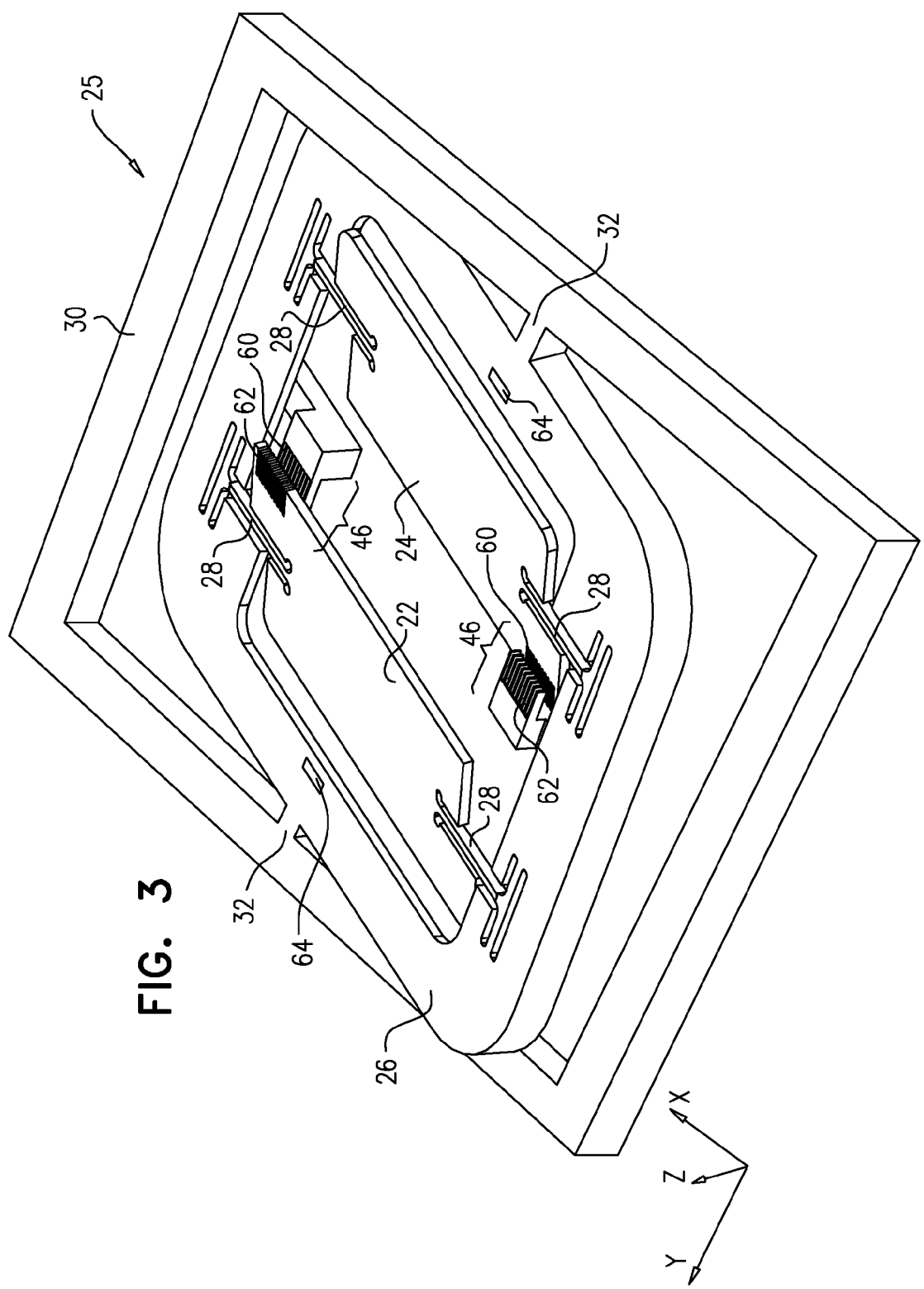
FIG. 3 is a schematic pictorial illustration of a gimbaled scanning mirror array, in accordance with an embodiment of the invention.

FIG. 2 is a schematic sectional view of device 20, taken along the line II-II in FIG. 1, in accordance with an embodiment of the invention. In this example, main drive 34 is magnetic, and comprises a stator 52 mounted on a chassis 56, which also holds base 30. A rotor 50, typically comprising a permanent magnet, is attached to the rear side of frame 26. Stator 52, which typically comprises a ferromagnetic material, is shaped to define a gap in which rotor 50 is positioned. Controller 44 (FIG. 1) applies a time-varying electrical current to coils 54 that are wound on stator 52, thus generating a time-varying magnetic field in the gap, which causes rotor 50 to rotate as shown in the figure. Controller 44 drives coils 54 at the desired rotational frequency of frame 26 on hinges 32. As illustrated in FIGS. 2 and 3 and explained above, the rotation of frame 26 causes mirrors 22 and 24 to oscillate in mutual synchronization about their respective hinges 28.

Although only a single stator and corresponding rotor are shown in FIG. 2, main drive 34 may comprise two (or more) such stator/rotor pairs, one adjacent to each of hinges 32, for example. Further details of magnetic drives of this sort are described, for example, in the above-mentioned U.S. Pat. No. 7,952,781 and U.S. Patent Application Publication 2015/0260847. Alternatively, main drive 34 may comprise any other suitable sort of drive that is known in the art, such as other types of magnetic drives, as well as electrostatic and piezoelectric drives. The coupling of rotational energy from frame 26 to mirrors 22 and 24 will be equally effective in conjunction with these other types of drives, as will the present techniques for correction of discrepancies in mirror synchronization.

FIG. 3 is a schematic pictorial illustration of gimbaled scanning mirror array 25, illustrating particularly the operation of adjustment circuit 46, in accordance with an embodiment of the invention. In this embodiment, each mirror 22, 24 has an adjustment circuit 46, comprising one conductive comb 60 that is attached to the edge of the mirror and a second conductive comb 62 attached to frame 26 so as to interleave with the corresponding comb 60. Controller 44 (FIG. 1) applies a corrective signal as an electrical potential difference between the combs 60 and 62, which increases or decreases the effective stiffness of hinges 28 of the corresponding mirror, depending on the characteristics of the corrective signal.

To determine whether a correction is needed, controller 44 receives output signals from sensors 64, which indicate when there is discrepancy in synchronization of the oscillation between mirrors 22 and 24. Sensors 64 may comprise, for example, capacitive sensors such as those described in US Patent Application Publication 2015/0204650, whose disclosure is incorporated herein by reference. Such sensors are capable of providing output signals that indicate the frequency, phase, and amplitude of oscillation of the respective mirrors. Alternatively, another suitable type of capacitive sensor is described in the above-mentioned U.S. Patent Application Publication 2015/0260847. Further alternatively, sensors 64 may operate on other principles, such as inductive or optical sensors, and may comprise any suitable sort of sensing elements that are known in the art.

As one example, assume controller 44 detects, based on the signals from sensors 64, a synchronization discrepancy in that the amplitude of oscillation of mirror 22 is greater than that of mirror 24. In this case, controller 44 may apply a DC potential between comb 60 on mirror 22 and the corresponding comb 62 on frame 26. The potential difference creates an attraction between combs 60 and 62, which consequently damps the oscillation of mirror 22. Controller 44 adjusts the DC potential until sensors 64 indicate that the amplitudes of oscillation of mirrors 22 and 24 are equal (to within a predefined resolution limit or error margin), meaning that the discrepancy is resolved.

Alternatively or additionally, controller 44 may apply a time-varying potential, at the resonant frequency, between comb 60 on mirror 24 and the corresponding comb 62 on frame 26. Controller 44 synchronizes the phase and frequency of this potential with the oscillation of the mirror, based on the signals from sensors 64, in order to boost the amplitude of oscillation of mirror 24 relative to mirror 22. For example, the potential may be switched on as mirror 24 swings toward its equilibrium point (where combs 60 and 62 interleave) and off as the mirror swings away from the equilibrium point. Alternatively, by reversing the phase, such a time-varying potential may be used to damp the mirror oscillation, Although the figures and description above relate to a particular optical design and layout of the components of scanning device 20, the principles of the present invention may be applied in scanning devices of other designs. For example, the scanning mirror assembly in device 20 may comprise mirrors and gimbals of different shapes, sizes, orientations and spacing from those shown in the figures. Alternative designs based on the principles set forth above will be apparent to those skilled in the art and are also considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A scanning device, comprising:
   a frame, having a central opening;
   an array comprising a plurality of parallel mirrors contained within the central opening of the frame;
   hinges, which respectively connect the mirrors to the frame and define respective, mutually-parallel axes of rotation of the mirrors relative to the frame;
   a main drive, which is configured to apply a driving force to the array so as to drive an oscillation of the mirrors about the hinges at a resonant frequency of the array;
   a sensor, which is configured to detect a discrepancy in a synchronization of the oscillation among the mirrors in the array; and
   an adjustment circuit, which is coupled to apply a corrective signal to at least one of the mirrors in order to alleviate the detected discrepancy,
   wherein the adjustment circuit comprises a first conductive comb attached to an edge of at least one of the mirrors and a second conductive comb attached to the frame so as to interleave with the first conductive comb, and the corrective signal is applied as an electrical potential difference between the first and second conductive combs.

2. The device according to claim 1, wherein the frame, the mirrors, and the hinges comprise an epitaxial semiconductor material, which is etched to define and separate the mirrors and the hinges from the frame.

3. The device according to claim 2, wherein the hinges comprise torsion hinges.

4. The device according to claim 1, and comprising a base surrounding the frame and rotationally connected to the frame so that the frame rotates, relative to the base, about a frame axis that is perpendicular to the mutually-parallel axes of rotation of the mirrors.

5. The device according to claim 4, wherein the main drive is configured to apply the driving force to the frame so as to cause the frame to rotate about the frame axis relative to the base, and wherein the mirrors are weighted asymmetrically so as to couple the oscillation of the mirrors about the respective axes to the rotation of the frame about the frame axis.

6. The device according to claim 5, wherein the driving force is applied to the frame at a gimbal frequency that is less than half of the resonant frequency of the array.

7. The device according to claim 1, wherein the electrical potential difference comprises a DC potential, which damps the oscillation of the at least one of the mirrors.

8. The device according to claim 1, wherein the electrical potential difference comprises a time-varying potential, which is applied at the resonant frequency.

9. A scanning device, comprising:
a frame, having a central opening;
an array comprising a plurality of parallel mirrors contained within the central opening of the frame;
hinges, which respectively connect the mirrors to the frame and define respective, mutually-parallel axes of rotation of the mirrors relative to the frame;
a main drive, which is configured to apply a driving force to the array so as to drive an oscillation of the mirrors about the hinges at a resonant frequency of the array;
a sensor, which is configured to detect a discrepancy in a synchronization of the oscillation among the mirrors in the array; and
an adjustment circuit, which is coupled to apply a corrective signal to at least one of the mirrors in order to alleviate the detected discrepancy,
wherein the adjustment circuit comprises a heating trace formed in a vicinity of one or more of the hinges, and the corrective signal is applied as a current flowing through the heating trace so as to increase a temperature of at least one of the hinges.

10. The device according to claim 1, and comprising:
a transmitter, which is configured to emit a beam of light toward a first mirror in the array, which reflects the beam so that as to scan the beam over a scene; and
a receiver, which is configured to receive, by reflection from at least second mirror in the array, the light reflected from the scene and to generate an output indicative of the light received from points in the scene.

11. A method for producing a scanning device, the method comprising:
etching a semiconductor wafer to define:
a frame, having a central opening;
an array comprising a plurality of parallel mirrors contained within the central opening of the frame; and
hinges, which respectively connect the mirrors to the frame and define respective, mutually-parallel axes of rotation of the mirrors relative to the frame;
coupling a main drive to apply a driving force to the array so as to drive an oscillation of the mirrors about the hinges at a resonant frequency of the array;
coupling a sensor to detect a discrepancy in a synchronization of the oscillation among the mirrors in the array; and
coupling an adjustment circuit to apply a corrective signal to at least one of the mirrors in order to alleviate the detected discrepancy,
wherein coupling the adjustment circuit comprises attaching a first conductive comb to an edge of at least one of the mirrors and attaching a second conductive comb to the frame so as to interleave with the first conductive comb, and applying the corrective signal as an electrical potential difference between the first and second conductive combs.

12. The method according to claim 11, and comprising etching the semiconductor wafer to define a base surrounding the frame and rotationally connected to the frame so that the frame rotates, relative to the base, about a frame axis that is perpendicular to the mutually-parallel axes of rotation of the mirrors.

13. The method according to claim 12, wherein coupling the main drive comprises applying the driving force to the frame so as to cause the frame to rotate about the frame axis relative to the base, wherein the mirrors are weighted asymmetrically so as to couple the oscillation of the mirrors about the respective axes to the rotation of the frame about the frame axis.

14. The method according to claim 13, wherein the driving force is applied to the frame at a gimbal frequency that is less than half of the resonant frequency of the array.

15. The method according to claim 11, wherein the electrical potential difference comprises a DC potential, which damps the oscillation of the at least one of the mirrors.

16. The method according to claim 11, wherein the electrical potential difference comprises a time-varying potential, which is applied at the resonant frequency.

17. The method according to claim 11, wherein coupling the adjustment circuit comprises forming a heating trace in a vicinity of one or more of the hinges, and applying the corrective signal as a current flowing through the heating trace so as to increase a temperature of at least one of the hinges.

18. The method according to claim 11, and comprising:
positioning a transmitter to emit a beam of light toward a first mirror in the array, which reflects the beam so that as to scan the beam over a scene; and
positioning a receiver to receive, by reflection from at least second mirror in the array, the light reflected from the scene and to generate an output indicative of the light received from points in the scene.

* * * * *